[12] United States Patent
Hashimoto (10) Patent No.: US 10,658,832 B2
(45) Date of Patent: May 19, 2020

(54) ELECTRICAL LEAKAGE DETECTION CIRCUIT AND ELECTRICAL LEAKAGE BREAKER (71) Applicant: ROHM CO., LTD., Ukyo-Ku, Kyoto (JP)

(72) Inventor: Shinichi Hashimoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 343 days.

(21) Appl. No.: 15/472,778

(22) Filed: Mar. 29, 2017

(65) Prior Publication Data
US 2017/0288390 A1 Oct. 5, 2017

(30) Foreign Application Priority Data

Apr. 1, 2016 (JP) .................................. 2016-074130

(51) Int. Cl.
*H02H 3/16* (2006.01)
*H02H 1/04* (2006.01)
(Continued)

(52) U.S. Cl.
CPC ............ *H02H 3/162* (2013.01); *G01R 31/50* (2020.01); *H02H 1/04* (2013.01); *H02H 3/33* (2013.01)

(58) Field of Classification Search
CPC . H02H 1/04; H02H 3/162; H02H 3/33; G01R 31/025
(Continued)

(56) References Cited

U.S. PATENT DOCUMENTS 5,856,902 A * 1/1999 Hashimoto ............ H02H 3/33
361/42
2004/0145841 A1* 7/2004 Lambardin ............ H02H 3/332
361/42
(Continued)

FOREIGN PATENT DOCUMENTS

CN 1173035 A 2/1998
CN 205051332 U * 2/2016
(Continued)

OTHER PUBLICATIONS

Machine translation of Shiotsu Chinese Patent Document CN 205051332 U Feb. 24, 2016 (Year: 2016).*
(Continued)

*Primary Examiner* — Kevin J Comber
(74) *Attorney, Agent, or Firm* — Cantor Colburn LLP (57) ABSTRACT

The present invention increases noise immunity of an electrical leakage detection circuit. A first comparator COMP1 generates a first comparison signal indicating a comparison result between a voltage corresponding to a detected signal from a zero-phase-sequence current transformer and a predetermined first threshold voltage $V_{TH1}$. A judgment circuit outputs a judgment signal indicating if there is electrical leakage based on the first comparison signal and outputs a mask signal corresponding to the first comparison signal. A mask circuit generates a latch input signal based on the judgment signal and the mask signal. An output stage comprises a latch circuit which latches a state of the latch input signal when the latch input signal is asserted. The output stage generates a drive signal corresponding to the state of the latch circuit.

15 Claims, 9 Drawing Sheets

(51) Int. Cl.
 *H02H 3/33* (2006.01)
 *G01R 31/50* (2020.01)
(58) Field of Classification Search
 USPC .......................................................... 361/101
 See application file for complete search history.

(56) References Cited

U.S. PATENT DOCUMENTS

2014/0029316 A1* 1/2014 Adragna ........... H02M 3/33523
 363/21.18
2017/0314971 A1* 11/2017 Lamesch ................. G01D 5/24

FOREIGN PATENT DOCUMENTS

| | | |
|---|---|---|
| CN | 205051332 U | 2/2016 |
| CN | 103430036 B | 3/2016 |
| JP | H4172915 A | 6/1992 |
| JP | H1094161 A | 4/1998 |
| JP | 2010176988 A | 8/2010 |
| JP | 2016021856 A | 2/2016 |
| JP | 2016024963 A | 2/2016 |

OTHER PUBLICATIONS

SIPO Office Action corresponding to Application No. 201710196464.8; dated May 17, 2019.
JP Office Action corresponding to Application No. 2016-074130; dated Nov. 22, 2019.
Second Office Action corresponding to CN 201710196464.8 dated Jan. 15, 2020.

\* cited by examiner

ELECTRICAL LEAKAGE DETECTION CIRCUIT AND ELECTRICAL LEAKAGE BREAKER

CROSS REFERENCE TO RELATED APPLICATIONS

The present invention claims priority under 35 U.S.C. § 119 to Japanese Application No. 2016-074130, filed Apr. 1, 2016, the entire content of which is incorporated herein by reference.

BACKGROUND

The present invention relates to a technique for detecting electrical leakage in an alternating current line.

Figure 1:
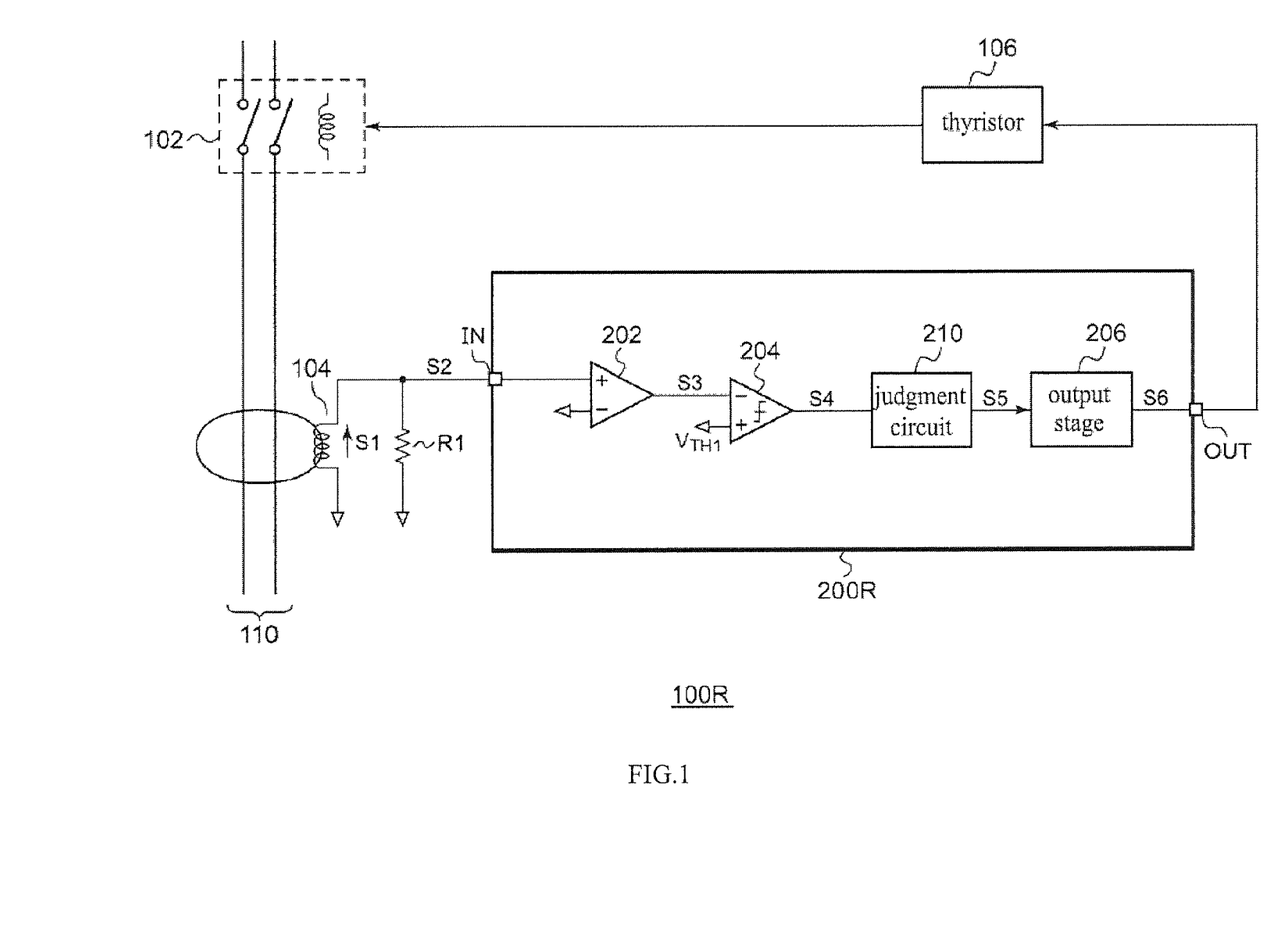
FIG. 1 is a circuit diagram of a conventional electrical leakage breaker.

An electrical leakage breaker is used to protect an alternating-current (AC) line 110 (AC: Alternating Current) and peripheral circuits from electrical leakage. FIG. 1 is a circuit diagram of a conventional electrical leakage breaker 100R. The electrical leakage breaker 100R includes a switch (also referred to as a contact or a breaker) 102, a zero-phase-sequence current transformer (ZCT) 104, and an electrical leakage detection circuit 200R. The switch 102 is provided on an AC line 110 and is normally in a contact closed state (ON). When an electrical leakage is detected, the switch 102 is changed to a contact open state and breaks the AC line 110. The AC line 110 may be multi-phase or single-phase.

Figure 2A:
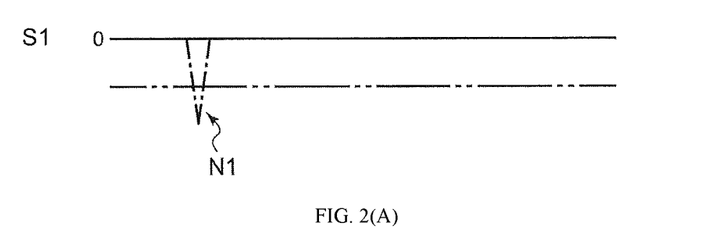
FIGS. 2(A) and 2(B) are waveform diagrams of detected current S1 while no electrical leakage occurs and while electrical leakage occurs, respectively.
Figure 2B:
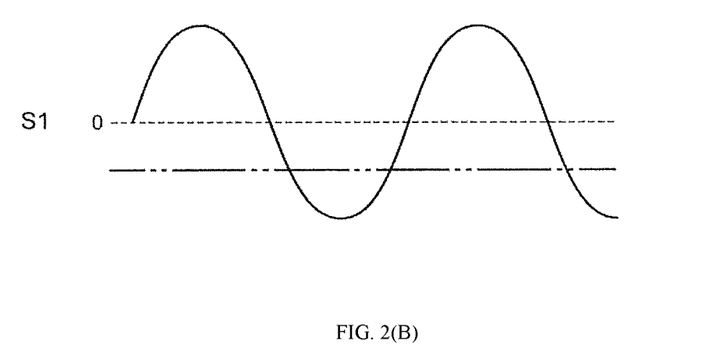

When an electrical leakage occurs due to a ground fault or other issue in the AC line 110, the zero-phase-sequence current transformer 104 generates an alternating detected current S1 on a secondary side of the ZCT 104. In a normal state, the detected current S1 is close to 0. The detected current S1 is converted into a detected voltage S2 by a resistor R1. FIGS. 2(A) and 2(B) are waveform diagrams of the detected current S1 during normal time and electrical leakage. FIG. 2(A) shows the waveform during normal time and FIG. 2(B) shows the waveform while electrical leakage occurs.

As shown in FIG. 1, the electrical leakage detection circuit 200R determines the presence or absence of electrical leakage based on the detected voltage S2 input to its input terminal (IN). When electrical leakage is detected, the electrical leakage detection circuit 200R drives a thyristor 106 connected to its output terminal (OUT) to turn off the switch 102.

The electrical leakage detection circuit 200 includes an amplifier 202, a comparator 204, a judgment circuit 210, and an output stage 206. The amplifier 202 amplifies the detected voltage S2 as necessary. The comparator 204 compares an output signal S3 of the amplifier 202 with a predetermined threshold voltage $V_{TH1}$, and generates a comparison signal S4 indicating a comparison result. Based on the comparison signal S4, the judgment circuit 210 judges the presence or absence of electrical leakage and generates a judgment signal S5 indicating a judgment result. Since the amplifier 202 is an inverting amplifier in this example, when an electrical leakage occurs, the detected signal S3 exceeds the threshold voltage $V_{TH1}$ (i.e., the detected signal S2 is less than the negative threshold voltage). The judgment signal S5 is asserted (for example, set to high level) when electrical leakage is judged to exist, and the judgment signal is negated (set to low level) in a normal state. When the judgment signal S5 is asserted, an output stage 206 latches the state and asserts (for example, high level) a drive signal S6 to fix the thyristor 106 in a driving state. Thus, once electrical leakage is detected, the switch 102 is kept in an OFF state until the output stage 206 is reset.

Noise enters the electrical leakage breaker 100R and the electrical leakage detection circuit 200R from various paths. For example, noise can be mixed as electromagnetic waves, lightning surge, current fluctuations of load equipment, and others. If electrical leakage is erroneously detected due to noise, the switch 102 is turned off and the downstream circuit becomes inoperative. Therefore, countermeasures against noise are necessary for the electrical leakage detection circuit 200R.

PRIOR TECHNICAL LITERATURE

[Patent Literature 1] JP201624963A
[Patent Literature 2] JP2016021856A

BRIEF SUMMARY OF THE INVENTION

Problems to be Solved in the Present Invention

For example, suppose a noise N1, indicated by a dashed line in FIG. 2(A), enters the detected voltage S2. Then, although electrical leakage does not occur, the comparison signal S4 becomes high level. Inventors of the present invention examined the following approaches as countermeasures against noise.

In a first approach, the judgment circuit 210 judges that an electrical leakage exists on condition that a high level of the comparison signal S4 has continued for a predetermined time or more. Thus, influence of the noise N1 can be suppressed. In a second approach, the judgment circuit 210 judges that an electrical leakage exists on condition that the comparison signal S4 has transitioned to the high level continuously for a predetermined number of cycles. According to these approaches, it is possible to suppress the influence of the noise N1 as shown in FIG. 2(A).

There are various ways in which noise enters a circuit. For example, it may be introduced via a power line of the electrical leakage detection circuit 200R. Here, if noise enters a power line or an output of the judgment circuit 210, the output stage 206 may respond to the noise and the drive signal S6 may be asserted. Alternatively, when noise is introduced in a power supply of the output stage 206, the drive signal S6 may be asserted. In the first or second approach above, the influence of such noise cannot be eliminated.

The present invention has been made in view of the above problems. An exemplary purpose of one embodiment is to provide an electrical leakage detection circuit and an electrical leakage breaker with enhanced noise immunity.

Technical Means for Solving Problems

One embodiment of the present invention relates to an electrical leakage detection circuit. The electrical leakage detection circuit comprises: a first comparator for generating a first comparison signal indicating a comparison result between a voltage corresponding to a detected signal from a zero-phase-sequence current transformer and a predetermined first threshold voltage; a judgment circuit for outputting a judgment signal indicating a presence or absence of electrical leakage based on the first comparison signal and outputting a mask signal corresponding to the first comparison signal; a mask circuit for generating a latch input signal based on the judgment signal and the mask signal; and an output stage for generating a drive signal according to a state of a latch circuit, wherein the latch circuit is included in the output stage and latches a state of the latch input signal when the latch input signal is asserted.

A mask signal having a predetermined level is generated under a condition where a possibility of electrical leakage is suggested by the first comparison signal. Erroneous detection due to noise can be prevented by allowing the judgment signal to act on the input of the latch circuit only while the mask signal is at the predetermined level.

The judgment circuit can include: a first timer circuit for generating a first temporary judgment signal, wherein the first temporary judgment signal is asserted when the first comparison signal remains at a predetermined level continuously for a predetermined length of time; and a waveform judging portion for generating a judgment signal based on the first temporary judgment signal. The mask signal can be the first temporary judgment signal.

The waveform judging portion can assert the judgment signal when the first temporary judgment signal is continuously asserted for a predetermined number of cycles.

An electrical leakage detection circuit of an embodiment can further comprise a second comparator that generates a second comparison signal indicating a comparison result between a voltage corresponding to a detected signal from the zero-phase-sequence current transformer and a predetermined second threshold voltage. A judgment circuit can generate a judgment signal based on the first comparison signal and the second comparison signal, and can generate a mask signal corresponding to the first comparison signal and the second comparison signal.

The judgment circuit can include: a first timer circuit for generating a first temporary judgment signal, wherein the first temporary judgment signal is asserted when the first comparison signal remains at a predetermined level continuously for a predetermined length of time; a second timer circuit for generating a second temporary judgment signal, wherein the second temporary judgment signal is asserted when the second comparison signal remains at a predetermined level continuously for a predetermined length of time; and a waveform judging portion for generating a judgment signal based on the first temporary judgment signal and the second temporary judgment signal.

The mask signal can correspond to the first temporary judgment signal and the second temporary judgment signal. The mask signal can correspond to a logical sum of the first temporary judgment signal and the second temporary judgment signal.

The waveform judging portion can assert the judgment signal when both of the following conditions are met: the first temporary judgment signal is continuously asserted for a predetermined number of cycles; and the second temporary judgment signal is continuously asserted for a predetermined number of cycles.

The mask circuit can generate a latch input signal according to a logical multiply of the judgment signal and the mask signal.

The mask circuit can generate the latch input signal according to a state of the latch circuit, in addition to the judgment signal and the mask signal.

The mask circuit can generate a logical sum of a feedback signal indicating a state of the latch circuit and the mask signal, and can generate the latch input signal according to a logical multiply of the logical sum and the judgment signal.

The latch circuit may include a cascode connection of an upper current mirror circuit and a lower current mirror circuit with their input/output terminals interconnected.

The mask circuit can include: a first switch whose on/off state is controlled according to the judgment signal and a first current source provided in series between a power supply line and an input of the latch circuit; a transistor provided between the input of the latch circuit and a ground line; and a control unit for controlling the transistor to be on or off according to the mask signal.

The control unit can control the on/off state of the transistor according to a feedback signal indicating a state of the latch circuit and the mask signal.

The electrical leakage detection circuit can be integrally integrated on a semiconductor substrate. "Integrally integrated" can mean cases where all constituent elements of the circuit are formed on the semiconductor substrate, or can mean cases where main constituent elements of the circuit are integrally integrated. Some resistors, capacitors and the like can be provided outside the semiconductor substrate for adjusting circuit constants. By integrating the circuit on one chip, the circuit area can be reduced and characteristics of the circuit elements can be kept uniform.

Another embodiment of the present invention relates to an electrical leakage breaker. The electrical leakage breaker comprises: a switch provided in an AC line; a zero-phase-sequence current transformer; and one of the above electrical leakage detection circuits controlling the switch based on a detected signal from the zero-phase-sequence current transformer.

It is to be noted that any combination of the above constituent elements and mutual substitution of constituent elements and expressions of the present invention among methods, apparatuses, systems, etc. are also effective as modes of the present invention.

Effects of the Present Invention

According to an embodiment of the present invention, noise immunity can be enhanced.

DETAILED DESCRIPTION

Hereinafter, the present invention will be described with reference to the drawings based on preferred embodiments. Identical or equivalent constituent elements, members, and processes shown in the drawings are denoted by the same reference numerals, and redundant descriptions are omitted as appropriate. Embodiments are illustrative and do not limit the invention. All features described in the embodiments and combinations thereof are not necessarily essential to the invention.

In the present specification, "a state in which member A is connected to member B" means not only the case where member A and member B are physically directly connected, but also the case where member A and member B are connected indirectly via other members which do not substantially affect their electrical connection state or do not impair the function or the effect exerted by their combination.

Similarly, "a state where member C is provided between member A and member B" means not only the case where member A and member C, or member B and member C are directly connected, but also the case where member A and member C, or member B and member C are connected indirectly via other members which do not substantially affect their electrical connection state or do not impair the function or the effect exerted by their combination.

Figure 3:
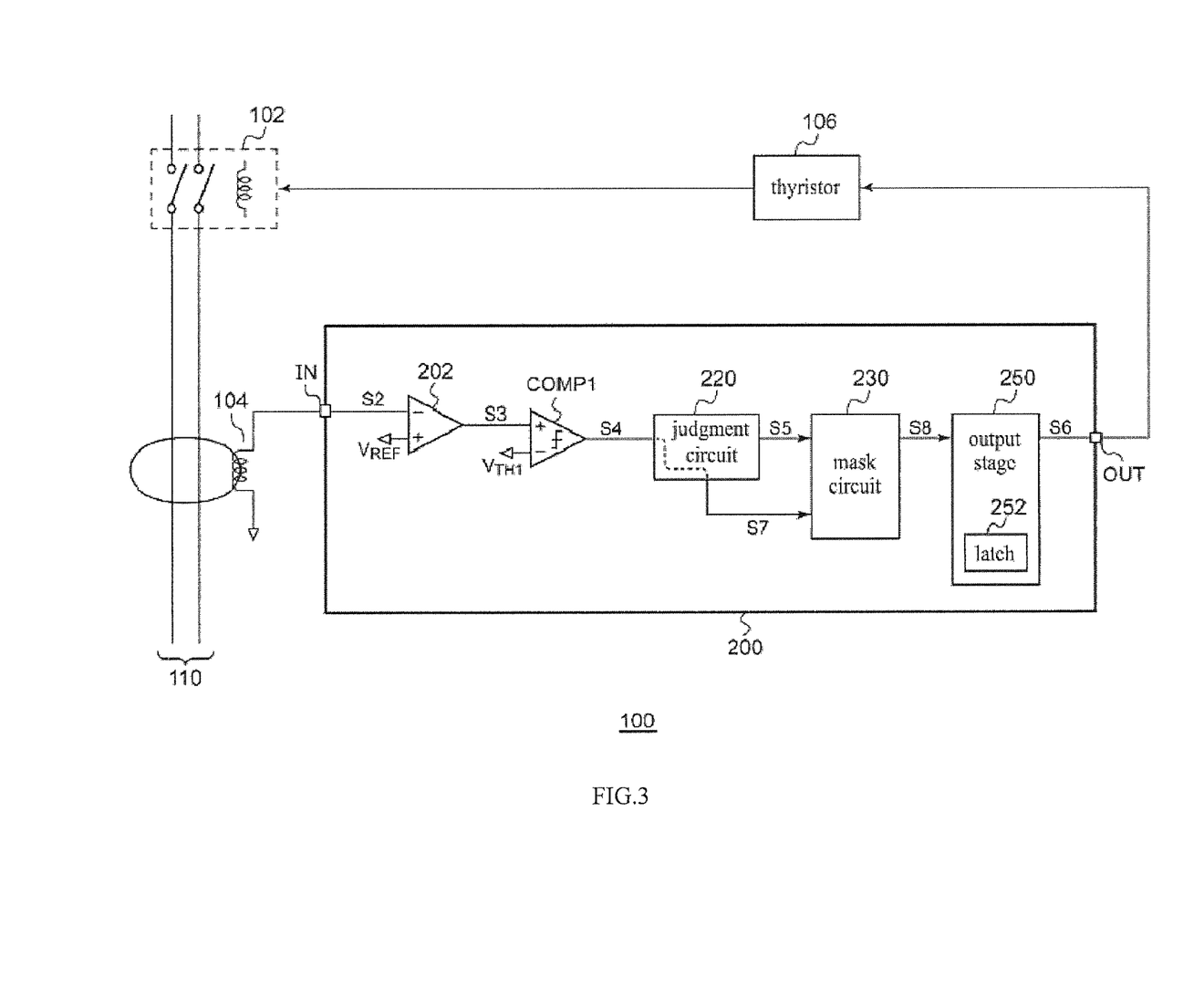
FIG. 3 is a circuit diagram of an electrical leakage breaker including an electrical leakage detection circuit according to an embodiment.

FIG. 3 is a circuit diagram of an electrical leakage breaker 100 including an electrical leakage detection circuit 200 according to an embodiment. The electrical leakage breaker 100 includes a switch 102, a zero-phase-sequence current transformer 104, a thyristor 106, and an electrical leakage detection circuit 200. A power supply voltage of the electrical leakage detection circuit 200 is generated by rectifying an AC voltage of an AC line with a diode rectifier and applying a constant voltage using a regulator (for example, a Zener diode) or the like. Therefore, a voltage of a power supply line (LVDD in FIG. 7) of the electrical leakage detection circuit 200 can be influenced by fluctuations in the AC line.

The electrical leakage detection circuit 200 receives a detected voltage S2 from the zero-phase-sequence current transformer 104 at input terminal (IN) and judges if there is electrical leakage. Upon detecting an existence of electrical leakage, the electrical leakage detection circuit 200 asserts a drive signal S6 from the output (OUT) terminal and drives the thyristor 106.

The electrical leakage detection circuit 200 includes an amplifier 202, a first comparator COMP1, a judgment circuit 220, a mask circuit 230, and an output stage 250. The electrical leakage detection circuit 200 is a functional IC integrated on one semiconductor substrate.

The amplifier 202 amplifies the detected voltage S2 and generates a detected voltage S3. In the present embodiment, the amplifier 202 is shown as an inverting amplifier, but the amplifier 202 can be a non-inverting amplifier or a buffer.

The first comparator COMP1 compares the detected voltage S3 with a predetermined first threshold $V_{TH1}$ and generates a first comparison signal S4 indicating a comparison result.

The judgment circuit 220 outputs a judgment signal S5 indicating if there is electrical leakage based on the first comparison signal S4. The judgment circuit 220 also outputs a mask signal S7 corresponding to the first comparison signal S4. The mask signal S7 is asserted (for example, set to high level) when the first comparison signal S4 indicates a possibility of electrical leakage, and the mask signal S7 is negated (for example, set to low level) when the possibility of electrical leakage is low. Note that a negated mask signal S7 corresponds to a mask state and an asserted mask signal S7 corresponds to a non-mask state (that is, passage of a signal).

The mask circuit 230 generates a latch input signal S8 based on the judgment signal S5 and the mask signal S7. The mask circuit 230 reflects an assertion of the judgment signal S5 to the latch input signal S8 while the mask signal S7 is asserted, that is, when the possibility of electrical leakage is suggested. The mask circuit 230 fixes the latch input signal S8 in a negated state while the mask signal S7 is negated.

The output stage 250 includes a latch circuit 252. The latch circuit 252 latches a state of the latch input signal S8 when the latch input signal S8 is asserted. The output stage 250 generates a drive signal S6 according to a state of the latch circuit 252.

The above is a configuration of the electrical leakage breaker 100. Next, operation of the electrical leakage breaker 100 will be described. For ease of understanding and simplification of explanation, the judgment signal S5 is asserted when the first comparison signal S4 is asserted for a predetermined length of time T. In addition, it is assumed that the mask signal S7 is identical to the first comparison signal S4. That is, assertion of the first comparison signal S4 corresponds to assertion of the mask signal S7, that is, the non-mask state. Conversely, negation of the first comparison signal S4 corresponds to negation of the mask signal S7, that is, the mask state.

Figure 4A:
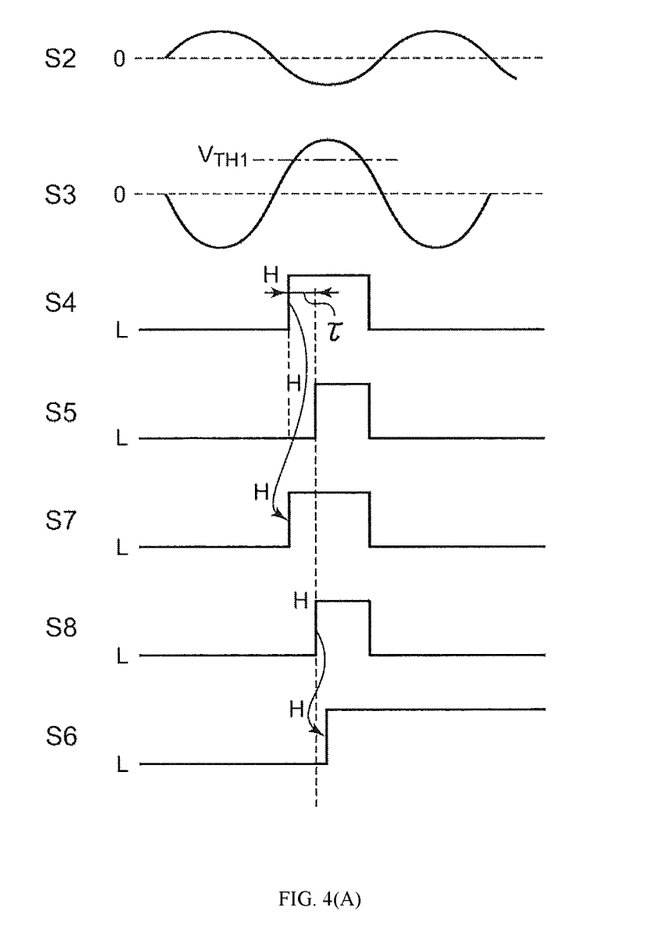
FIGS. 4(A) and 4(B) are operation waveform diagrams of the electrical leakage breaker of FIG. 3 showing waveforms while electrical leakage occurs and while no electrical leakage occurs, respectively.

FIG. 4(A) is an operation waveform diagram of the electrical leakage breaker 100 of FIG. 3 while electrical leakage occurs. Due to the electrical leakage, the amplitude of the detected voltage S2 increases and the detected voltage S3 exceeds the threshold voltage $V_{TH1}$. As a result, the first comparison signal S4 is asserted. In response to the assertion of the first comparison signal S4, the judgment circuit 220 asserts the judgment signal S5 and asserts the mask signal S7.

In response to the assertion of the mask signal S7, the mask circuit 230 transmits the assertion of the judgment signal S5 to the latch input signal S8, which is an input of the output stage 250. In response to the assertion of the latch input signal S8, the output stage 250 asserts the drive signal S6 and latches in the state of the drive signal S6.

Figure 4B:
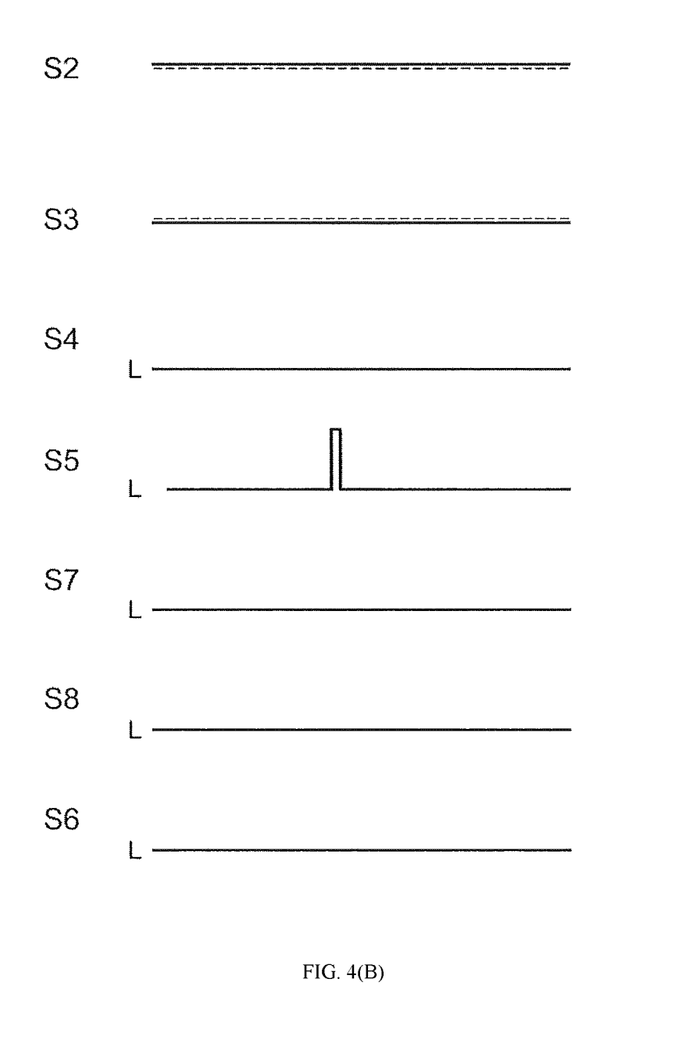

FIG. 4(B) is an operation waveform diagram of the electrical leakage breaker 100 of FIG. 3 while no electrical leakage occurs. While no electrical leakage occurs, the first comparison signal S4, the mask signal S7, and the judgment signal S5 are all negated (that is, set to low level).

Assume that the judgment signal S5 is asserted due to the influence of a noise N2, while no electrical leakage occurs. Since no electrical leakage has occurred, the first comparison signal S4 is negated, so the mask signal S7 is also negated. Since the mask signal S7 is negated, the mask circuit 230 does not transmit the assertion of the judgment signal S5 caused by the noise to the latch input signal S8 (which is an input of the output stage 250), and the latch input signal S8 remains at a low level.

The above description illustrates operation of the electrical leakage breaker 100. According to the electrical leakage breaker 100, it is possible to prevent a malfunction due to noise and to enhance noise immunity.

While the mask signal S7 is negated (that is, the period during which the possibility of electrical leakage is not suggested), the mask circuit 230 fixes the input S8 of the latch circuit 252 to a low level (negated) and prevents activation of the latch circuit 252. As a result, even if noise enters the power supply line LVDD of the latch circuit 252, activation of the latch circuit 252 due to noise is prevented and noise immunity is enhanced.

The present invention extends to various devices and circuits which are grasped as the block diagram and circuit diagram of FIG. 3 or derived from the above description, and are not limited to specific configurations. The following description is not intended to narrow the scope of the present invention. In order to aid understanding of the essence of the present invention and circuit operation and to clarify them, other embodiments or specific configuration examples will be explained.

First Embodiment

Figure 5:
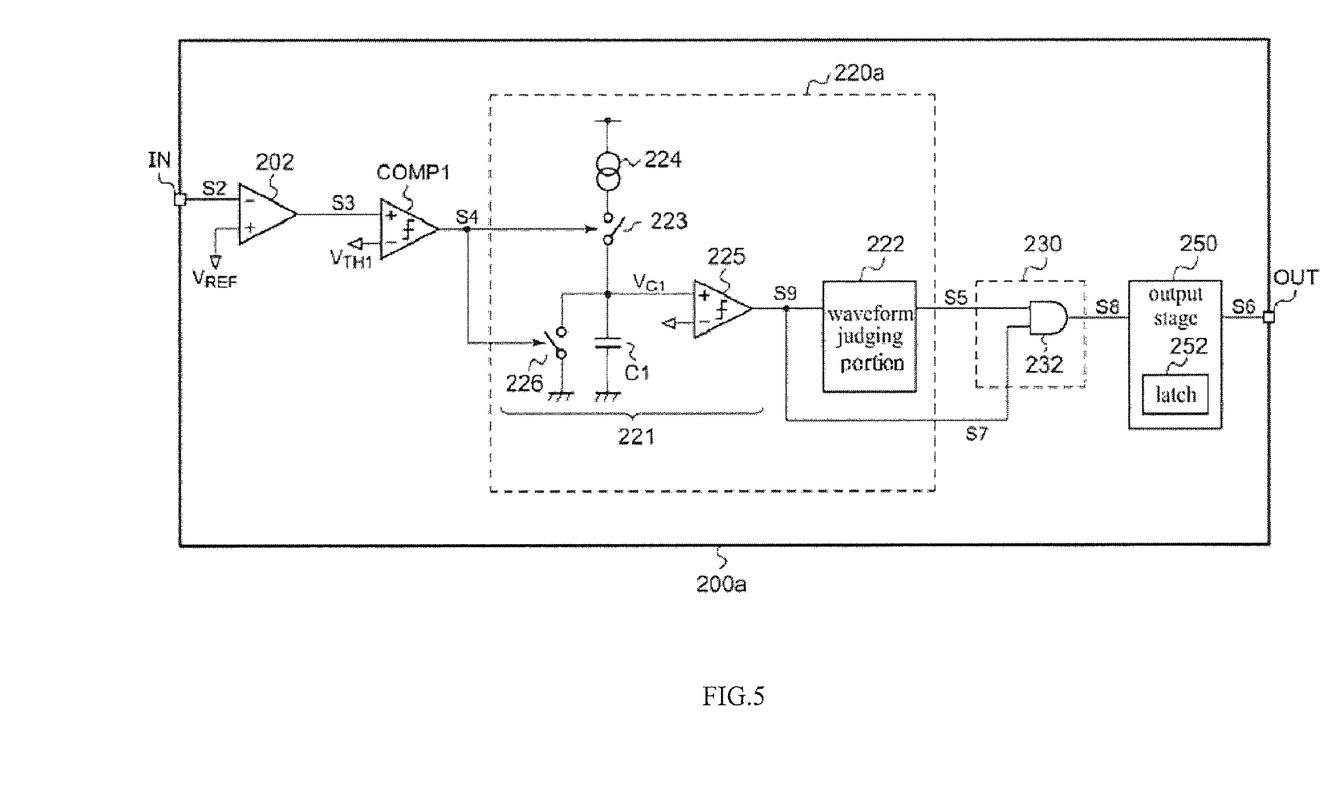
FIG. 5 is a circuit diagram of an electrical leakage detection circuit according to a first embodiment.

FIG. 5 is a circuit diagram of an electrical leakage detection circuit 200a according to a first embodiment. A judgment circuit 220a includes a first timer circuit 221 and a waveform judging portion 222. The first timer circuit 221 asserts a first temporary judgment signal S9 when a first comparison signal S4 remains continuously at a predetermined level (that is, a level suggesting the possibility of electrical leakage) for a predetermined length of time. In this embodiment, the first temporary judgment signal S9 is also used as the mask signal S7 and is supplied to the waveform judging portion 222 and a mask circuit 230.

In one example, the first timer circuit 221 is configured with an analog timer. When the first comparison signal S4 is asserted, a switch 226 is turned off and a switch 223 is turned on, and a capacitor C1 is charged by a current generated by a current source 224. A comparator 225 asserts the first temporary judgment signal S9 when a voltage $V_{C1}$ of the capacitor exceeds a threshold value $V_T$. When the first comparison signal S4 is negated, the switch 226 is turned on to discharge the capacitor C1 and reset the capacitor voltage $V_{C1}$ to zero. The first timer circuit 221 can be configured with a digital timer.

The waveform judging portion 222 generates a judgment signal S5 based on the first temporary judgment signal S9. For example, the waveform judging portion 222 can assert the judgment signal S5 as soon as the first temporary judgment signal S9 is asserted.

Alternatively, the waveform judging portion 222 can assert the judgment signal S5 when the first temporary judgment signal S9 is asserted continuously for a predetermined number of cycles. Thus, noise immunity can be further enhanced.

The mask circuit 230 includes an AND circuit 232 that generates a logical multiply of the judgment signal S5 and the mask signal S7 and outputs a latch input signal S8 according to the logical multiply. The configuration of the mask circuit 230 is not particularly limited.

Second Embodiment

Figure 6:
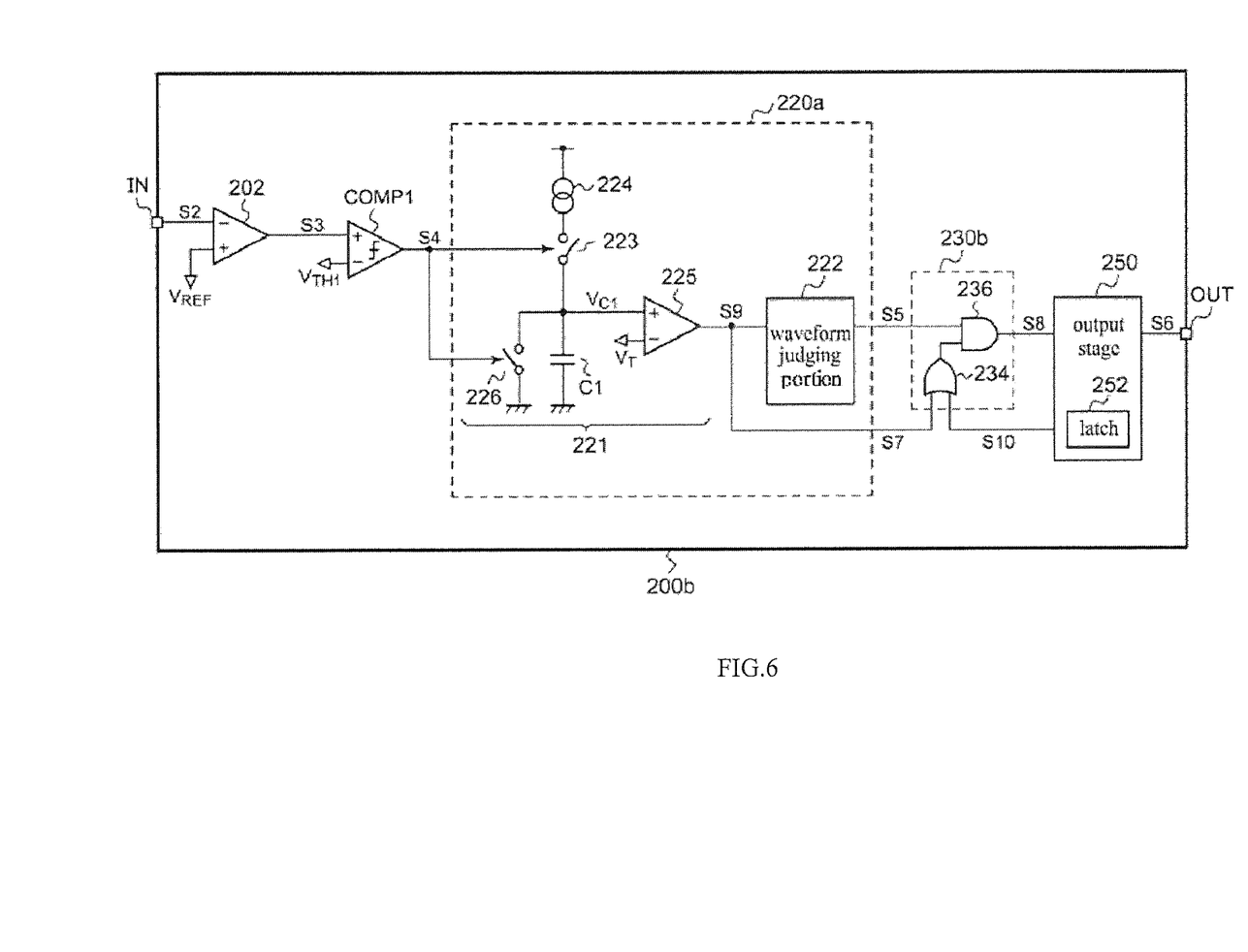
FIG. 6 is a circuit diagram of an electrical leakage detection circuit according to a second embodiment.

FIG. 6 is a circuit diagram of an electrical leakage detection circuit 200b according to a second embodiment. The judgment circuit 220a of FIG. 6 is similar to that of FIG. 5. In addition to the judgment signal S5 and the mask signal S7, a feedback signal S10 generated in an output stage 250 and indicating a state of a latch circuit 252 is input in the mask circuit 230b. The feedback signal S10 is asserted (for example, set to high level) when the latch circuit 252 is activated and negated (for example, set to low level) when the latch circuit 252 is inactive.

The mask circuit 230b includes an OR circuit 234 for generating a logical sum S11 of the mask signal S7 and the feedback signal S10, and an AND circuit 236 for generating a logical multiply of the logical sum S11 and the judgment signal S5. The mask circuit 230b generates a latch input signal S8 according to the output of the AND circuit 236.

According to this mask circuit 230b, assertion of the judgment signal S5 is reflected to the latch input signal S8 only when at least one of the mask signal S7 or the feedback signal S10 is asserted. On the other hand, the judgment signal S5 is masked when both of the mask signal S7 and the feedback signal S10 are negated, that is, a state where no possibility of electrical leakage is suggested.

According to this embodiment, by reflecting the state of the latch circuit 252 to the latch input signal S8, the mask function can be canceled in a normal state.

Figure 7:
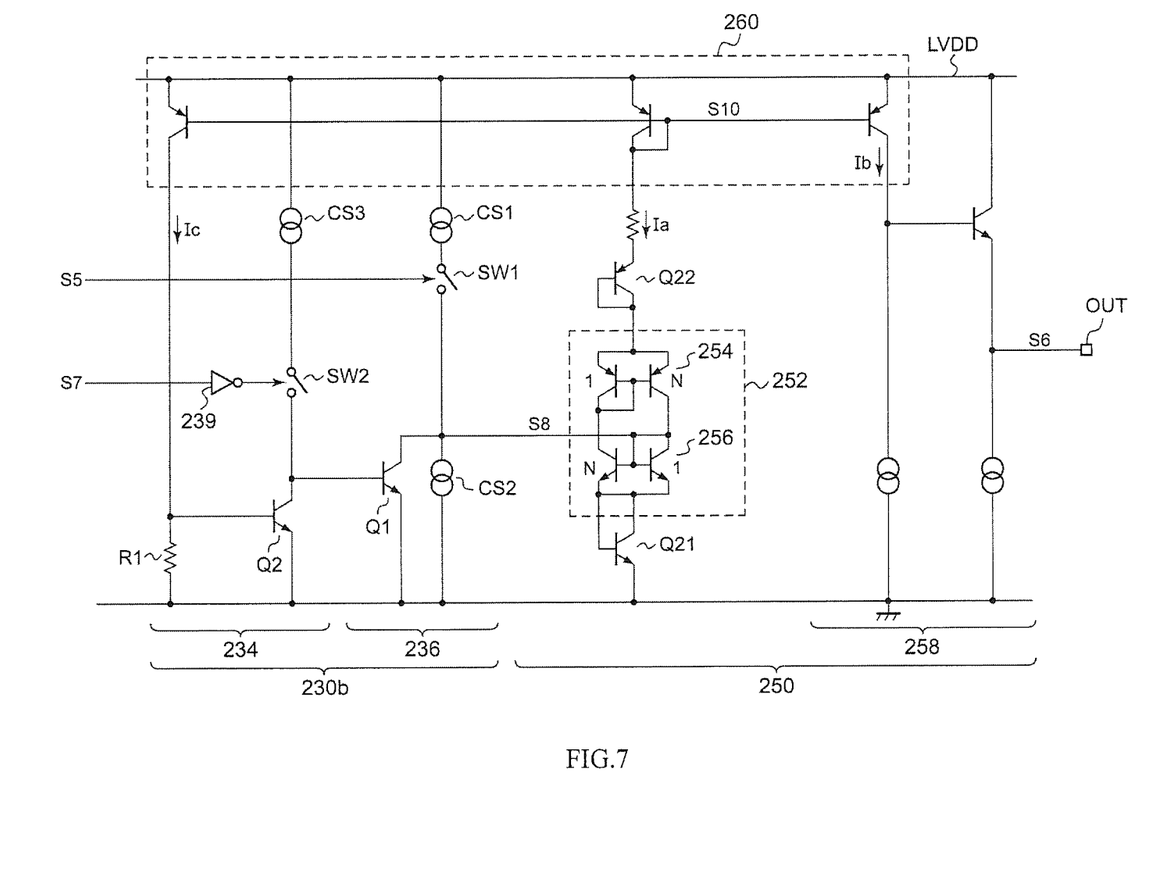
FIG. 7 is a circuit diagram showing a configuration example of the mask circuit and the output stage of FIG. 6.

FIG. 7 is a circuit diagram showing a configuration example of the mask circuit 230b and the output stage 250 in FIG. 6. The latch circuit 252 includes a cascode connection of an upper current mirror circuit 254 and a lower current mirror circuit 256 with their input/output terminals interconnected. The mirror ratios of the upper current mirror circuit 254 and the lower current mirror circuit 256 are both 1:N, and a positive feedback is returned. Therefore, once the latch input signal S8 (output of the mask circuit 230b) is asserted and a current begins to flow in the lower current mirror circuit 256, then the current is amplified irrespective of the state of the latch input signal S8. This current continues to flow until the power supply is turned off, or until reset by a reset circuit (not shown).

Several transistors (diodes) Q21 and Q22 are positioned on the upper side and the lower side of the latch circuit 252. A current mirror circuit 260 copies a current Ia flowing in the latch circuit 252. A driver 258 of the output stage 250 outputs a drive signal S6 corresponding to a current Ib proportional to the current Ia. The configuration of the driver 258 is not particularly limited.

The current mirror circuit 260 feedbacks a current Ic, proportional to the current Ia, to the mask circuit 230b as the feedback signal S10. Alternatively, a base voltage of the current mirror circuit 260 can be taken as the feedback signal S10.

The AND circuit 236 includes a first current source CS1, a switch SW1, and a transistor Q1 in series between a power supply line LVDD and a ground line. A second current source CS2 for generating a current smaller than a current generated by the first current source CS1 can be provided in parallel with the transistor Q1. The second current source CS2 can be omitted. The switch SW1 is turned on when the judgment signal S5 is asserted. At such time, if the transistor Q1 is off, a current flows into the lower current mirror circuit 256, and the latch circuit 252 is activated.

When the transistor Q1 is on, regardless of the state of the switch SW1, the latch input signal S8 is pulled down to a low level, and the latch circuit 252 is fixed in an inactive state. This prevents activation of the latch circuit 252 due to power supply noise.

A signal from the OR circuit (also referred to as a control unit) 234 is input to the base of the transistor Q1. The OR circuit 234 turns off the transistor Q1 when the mask signal S7 is asserted or when the current Ic flows. At other times, that is, when the mask signal S7 is negated and the current Ic does not flow, the OR circuit 234 turns on the transistor Q1.

In an embodiment, the OR circuit 234 includes an inverter 239, a resistor R1, a transistor Q2, a switch SW2, and a current source CS3. Note that the configuration of the OR circuit 234 is not limited to that described in this example.

According to the mask circuit 230b and the output stage 250 in FIG. 7, influence of noise can be favorably eliminated. If it is desired to configure the mask circuit 230 of FIG. 5, the circuit configuration of the OR circuit (control unit) 234 can be modified so that the transistor Q1 of the AND circuit 236 is controlled according to only the mask signal S7.

Third Embodiment

Figure 8:
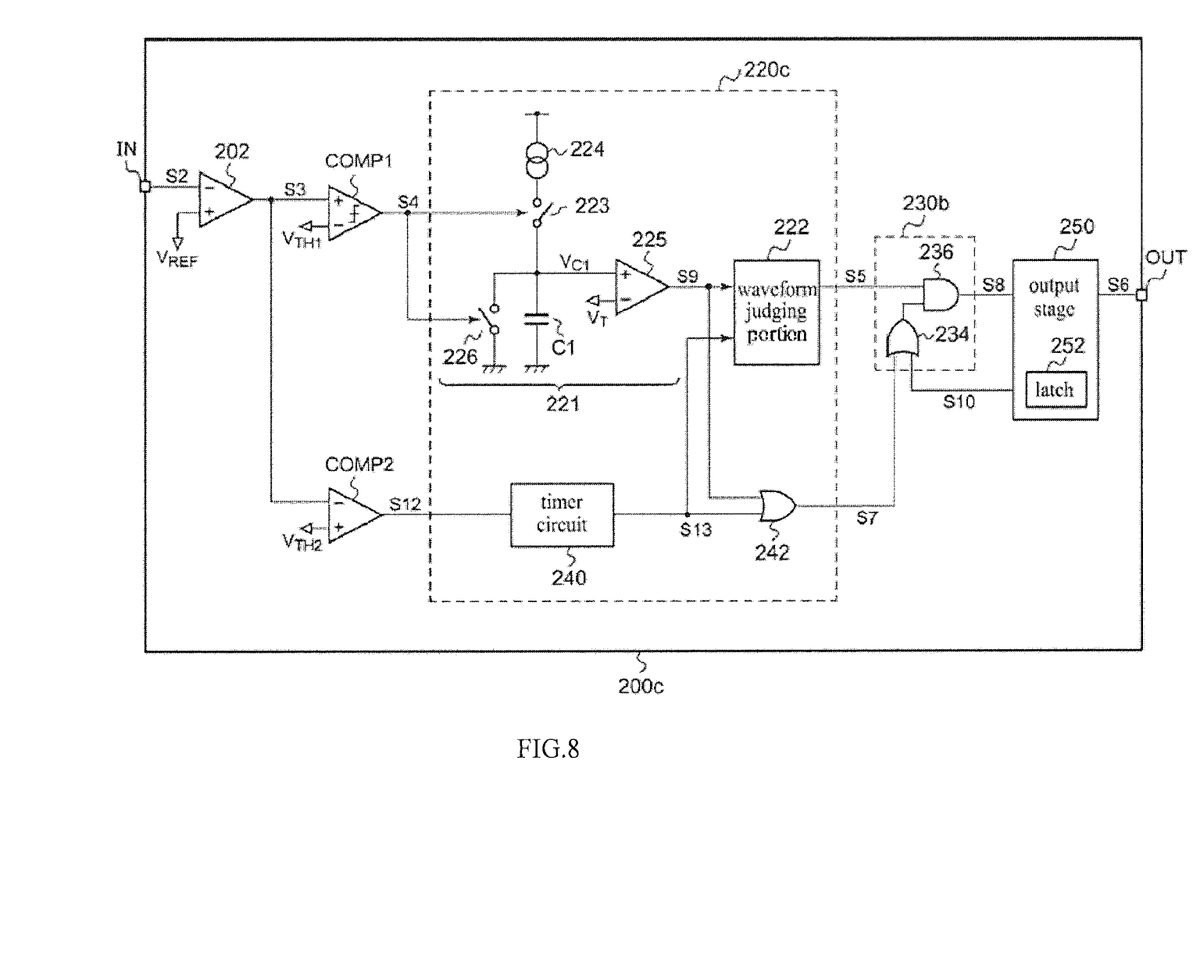
FIG. 8 is a circuit diagram of an electrical leakage detection circuit according to a third embodiment.

FIG. 8 is a circuit diagram of an electrical leakage detection circuit 200c according to a third embodiment. The electrical leakage detection circuit 200c includes a second comparator COMP2 in addition to the electrical leakage detection circuit 200b of FIG. 6. The second comparator COMP2 generates a second comparison signal S12 indicating a comparison result between a detected signal S3 from a zero-phase-sequence current transformer 104 and a predetermined second threshold voltage $V_{TH2}$. For example, the second threshold voltage $V_{TH2}$ is negative, and the second comparator COMP2 asserts the second comparison signal S12 when S3<$V_{TH2}$.

The judgment circuit 220c generates a judgment signal S5 and a mask signal S7 based on a first comparison signal S4 and the second comparison signal S12. The judgment circuit 220c further includes a second timer circuit 240 and an OR circuit 242 in addition to the judgment circuit 220b of FIG. 6. The second timer circuit 240 asserts a second temporary judgment signal S13 when the second comparison signal S12 remains at a predetermined level (that is, a level suggesting the possibility of electrical leakage) for a predetermined length of time. The second timer circuit 240 is configured in a manner similar to that of the first timer circuit 221.

The OR circuit 242 outputs a logical sum of a first temporary judgment signal S9 and the second temporary judgment signal S13 as the mask signal S7.

A waveform judging portion 222 generates the judgment signal S5 based on the first temporary judgment signal S9 and the second temporary judgment signal S13. For example, the waveform determining part 222 can assert the judgment signal S5 when at least one of the first temporary judgment signal S9 and the second temporary judgment signal S13 is asserted continuously for a predetermined number of cycles. Alternatively, the waveform determining part 222 can assert the judgment signal S5 when the first temporary judgment signal S9 and the second temporary judgment signal S13 are alternately asserted for a predetermined number of cycles.

Detection of electrical leakage based on only one of the first comparator COMP1 and the second comparator COMP2 corresponds to half-wave rectification, and suffers from a delay in detection of up to half a cycle. In contrast, the third embodiment corresponds to full-wave rectification by comparing the detected voltage S3 with two threshold values, one each on the positive and negative sides. Thus, the detection delay of electrical leakage is reduced.

The present invention has been described above based on embodiments. It is to be understood by those skilled in the art that these embodiments are merely examples, various variations can be made to the combination of each constituent element and each processing process, and that such variations are also within the scope of the present invention. Following are descriptions of several such variations.

(First Variation)

In the electrical leakage detection circuit 200 of FIGS. 6 and 8, the OR circuit 234 of the mask circuit 230b can be omitted, and monitoring of the state of the feedback signal S10 can be omitted.

(Second Variation)

In FIG. 8, the judgment circuit 220c can output a logical sum of the first comparison signal S4 and the second comparison signal S12 as the mask signal S7.

(Third Variation)

The AC line 110 can be a three-phase AC line.

(Fourth Variation)

The mask circuit 230 can be configured by a combined circuit, a sequential circuit, and a combined sequential circuit. That is, the mask circuit 230 can be configured by a combination of logic gates such as an AND gate, a NAND gate, an OR gate, a NOR gate, and an inverter. In addition, the latch circuit 252 can also be configured using logic gates.

(Fifth Variation)

In the embodiments, assertion is set to high level and negation is set to low level. However, the present invention is not limited thereto, and can be configured with negative logic, in which assertion is set to low level and negation is set to high level. In addition, the logic system applied can be different for each signal.

While the present invention has been described with reference to specific embodiments, it is to be understood that the embodiments are only illustrative of the principles and applications of the present invention. Many variations and changes of arrangements are permitted in the embodiments without departing from the spirit of the present invention defined in the claims.

What is claimed is:

1. An electrical leakage detection circuit, comprising:
   a first comparator for generating a first comparison signal indicating a comparison result between a voltage corresponding to a detected signal from a zero-phase-sequence current transformer and a predetermined first threshold voltage;
   a judgment circuit for outputting a judgment signal indicating if there is electrical leakage based on the first comparison signal and outputting a mask signal corresponding to the first comparison signal;
   a mask circuit for generating a latch input signal based on the judgment signal and the mask signal; and
   an output stage comprising a latch circuit;
   wherein the latch circuit latches a state of the latch input signal when the latch input signal is asserted, and the output stage generates a drive signal corresponding to state of the latch circuit,
   the judgment circuit comprises:
      a first timer circuit for generating a first temporary judgment signal, wherein the first temporary judgment signal is asserted when the first comparison signal remains at a predetermined level continuously for a predetermined length of time; and
      a waveform judging portion for generating the judgment signal based on the first temporary judgment signal, and
   the mask signal is the first temporary judgment signal.

2. The electrical leakage detection circuit of claim 1, wherein the waveform judging portion asserts the judgment signal when the first temporary judgment signal is continuously asserted for a predetermined number of cycles.

3. The electrical leakage detection circuit of claim 1, further comprising a second comparator for generating a second comparison signal indicating comparison result between detected signal from the zero-phase-sequence current transformer and a predetermined second threshold voltage;
   wherein the judgment circuit generates the judgment signal based on the first comparison signal and the second comparison signal, and generates the mask signal corresponding to the first comparison signal and the second comparison signal.

4. The electrical leakage detection circuit of claim 3, wherein the judgment circuit comprises:
a second timer circuit for generating a second temporary judgment signal, wherein the second temporary judgment signal is asserted when the second comparison signal remains at a predetermined level continuously for a predetermined length of time, wherein
the waveform judging portion is configured for generating the judgment signal based on the first temporary judgment signal and the second temporary judgment signal.

5. The electrical leakage detection circuit of claim 4, wherein the mask signal corresponds to the first temporary judgment signal and the second temporary judgment signal.

6. The electrical leakage detection circuit of claim 5, wherein the mask signal corresponds to a logical sum of the first temporary judgment signal and the second temporary judgment signal.

7. The electrical leakage detection circuit of claim 4, wherein the waveform judging portion asserts the judgment signal when the first temporary judgment signal is continuously asserted for a predetermined number of cycles and the second temporary judgment signal is continuously asserted for a predetermined number of cycles.

8. The electrical leakage detection circuit of claim 1, wherein the mask circuit generates the latch input signal according to a logical multiply of the judgment signal and the mask signal.

9. The electrical leakage detection circuit of claim 1, wherein the mask circuit generates the latch input signal according to a state of the latch circuit, the judgment signal and the mask signal.

10. The electrical leakage detection circuit of claim 9, wherein the mask circuit generates a logical sum of a feedback signal indicating a state of the latch circuit and the mask signal, and generates the latch input signal according to a logical multiply of the logical sum and the judgment signal.

11. The electrical leakage detection circuit of claim 1, wherein the latch circuit comprises a cascode connection of an upper current mirror circuit and a lower current mirror circuit, and input/output terminals of the upper current mirror circuit and the lower current mirror circuit are interconnected.

12. The electrical leakage detection circuit of claim 1, wherein the mask circuit comprises:
a first switch whose on/off state is controlled according to the judgment signal and a first current source provided in series between a power supply line and an input of the latch circuit;
a transistor provided between the input of the latch circuit and a ground line; and
a control unit for controlling on/off state of the transistor according to the mask signal.

13. The electrical leakage detection circuit of claim 12, wherein the control unit controls on/off state of the transistor according to a feedback signal indicating a state of the latch circuit and the mask signal.

14. The electrical leakage detection circuit of claim 1, integrally integrated on one semiconductor substrate.

15. An electrical leakage breaker, comprising:
a switch in an alternating current (AC) line;
a zero-phase-sequence current transformer; and
the electrical leakage detection circuit of claim 1, for controlling the switch based on detected signal from the zero-phase-sequence current transformer.

* * * * *